(12) United States Patent
Newton et al.

(10) Patent No.: US 7,940,058 B2
(45) Date of Patent: May 10, 2011

(54) CAPACITIVE MEASUREMENTS WITH FAST RECOVERY CURRENT RETURN

(75) Inventors: David W. Newton, Tualatin, OR (US); Kenneth V. Almonte, Portland, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 137 days.

(21) Appl. No.: 11/753,177

(22) Filed: May 24, 2007

(65) Prior Publication Data

US 2008/0290879 A1 Nov. 27, 2008

(51) Int. Cl.
*G01R 31/12* (2006.01)

(52) U.S. Cl. ......... 324/548; 324/676; 324/678; 324/713

(58) Field of Classification Search .................... 324/548
See application file for complete search history.

(56) References Cited

U.S. PATENT DOCUMENTS

| | | | | |
|---|---|---|---|---|
| 5,229,653 A | * | 7/1993 | Lamarche | 307/116 |
| 5,402,329 A | * | 3/1995 | Wittenbreder, Jr. | 363/16 |
| 5,677,634 A | | 10/1997 | Cooke et al. | |
| 6,008,630 A | * | 12/1999 | Prasad | 323/222 |
| 2002/0196030 A1 | * | 12/2002 | Kamitani | 324/523 |
| 2005/0218913 A1 | * | 10/2005 | Inaba et al. | 324/678 |
| 2007/0177417 A1 | * | 8/2007 | Corulli et al. | 365/145 |

FOREIGN PATENT DOCUMENTS

| | | |
|---|---|---|
| JP | 58-102173 | 6/1983 |
| JP | 9-243693 | 9/1997 |
| JP | 9-243695 | 9/1997 |
| JP | 2002-311074 A | 10/2002 |

OTHER PUBLICATIONS

Keithley Application Note Series, No. 315, Capacitor Leakage Measurement using a Model 6517A Electrometer, Keithley Instruments, Inc., Copyright 2001.*
Keithley Application Note No. 315, "Capacitor Leakage Measurements using a Model 6517A Electrometer", Keithley Application Note Series, Copyright 2001, Keithley Instruments, Inc.*

* cited by examiner

*Primary Examiner* — Melissa J Koval
*Assistant Examiner* — Benjamin M Baldridge
(74) *Attorney, Agent, or Firm* — Young Basile

(57) ABSTRACT

An apparatus and method for measuring the leakage current of capacitive components. A switch that grounds a terminal of a component being tested is closed while the component is charged to a desired test voltage. When this charging is complete, the switch opens so that the diode terminal is at the same potential as the input amplifier's virtual ground. An accurate and fast measurement of the leakage current of the component can be measured.

20 Claims, 2 Drawing Sheets

CAPACITIVE MEASUREMENTS WITH FAST RECOVERY CURRENT RETURN

TECHNICAL FIELD

The present invention relates in general to a test for capacitive components.

BACKGROUND

In a known apparatus and method for testing a capacitive component, such as a capacitor, the component is first charged to a desired voltage. Then, the leakage current is measured. An out-of-range value for the leakage current can indicate that the component is faulty.

BRIEF SUMMARY

Embodiments of the invention provide a way to speed up testing of capacitive components, which is particularly desirable in automated, high-volume manufacturing processes. In particular, the invention provides embodiments of an apparatus and of a method that allow testing with improved accuracy immediately after the component reaches full charge.

One apparatus for testing a capacitive component taught herein includes a current source coupled to one terminal of the capacitive component and that supplies a current to the capacitive component to reach a desired test voltage. A meter is coupled to a second terminal of the capacitive component and measures a leakage current across the capacitive component. This apparatus is improved by a switch coupled between the second terminal of the capacitive component and ground and a control device for the switch. The control device is operable to keep the switch closed while the current source supplies the current to capacitive component and to open the switch after the capacitive component reaches the desired test voltage at the one terminal and prior to measurement of the leakage current by the meter.

Another apparatus taught herein for testing a capacitive component also includes the current source and the meter. The apparatus further comprises a normally-closed switch coupled between the second terminal of the capacitive component and ground and means for opening the normally-closed switch after the capacitive component reaches the desired test voltage at the one terminal and prior to measurement of the leakage current by the meter.

One method taught herein for testing a capacitive component uses a current source coupled to one terminal of the capacitive component and a meter coupled to a second terminal of the capacitive component. The method comprises charging the one terminal of the capacitive component to a desired test voltage using a current from the current source while a switch coupled between the second terminal of the capacitive component and ground is closed, opening the switch when the one terminal of the capacitive component reaches the desired test voltage and measuring a leakage current of the capacitive component using the meter after opening the switch.

The inventive features of these embodiments and others are described in more detail below.

BRIEF DESCRIPTION OF THE DRAWINGS

The description herein makes reference to the accompanying drawings wherein like reference numerals refer to like parts throughout the several views, and wherein.

DETAILED DESCRIPTION OF EMBODIMENTS OF THE INVENTION

The apparatus and method for capacitive measurements taught herein are described with reference to FIGS. 1 and 2. Comparison to the output of a conventional test is described with reference to FIG. 3.

Figure 1:
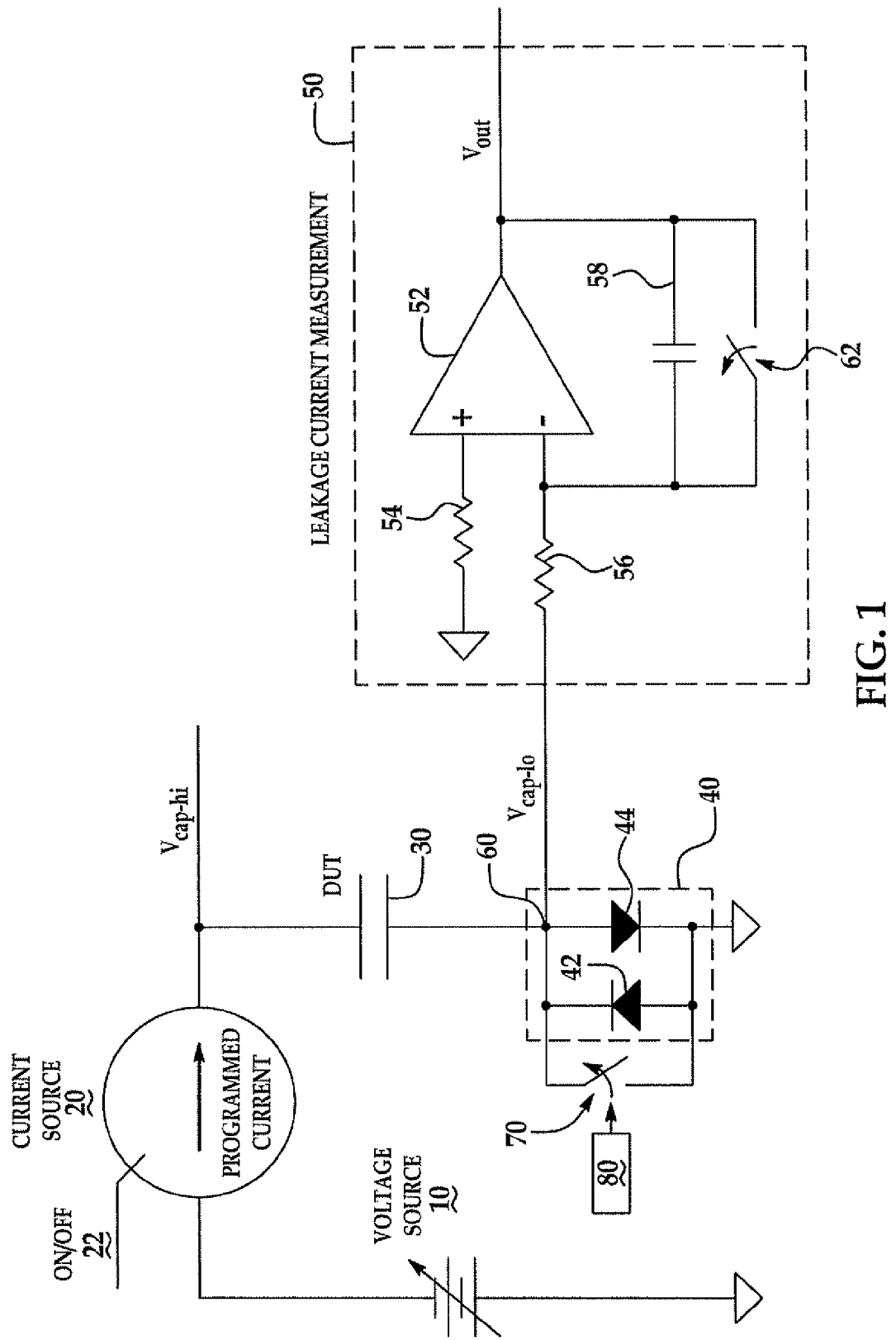
FIG. 1 is a schematic diagram of a fast recovery current return circuit in accordance with one embodiment of the invention.

FIG. 1 shows a voltage source 10 coupled to a current source 20. The current source 20 is coupled to a capacitive device under test 30 (hereinafter, DUT 30). The DUT 30 is coupled to a diode clamp 40 and to the input of a meter 50 to measure the leakage current of the DUT 30.

The voltage source 10 is set to a value between 0 volts and a desired test voltage for the DUT 30. For example, the test voltage can vary between 2 volts to 1000 volts. One appropriate test voltage for a 100 µF capacitor is 5 volts. The current source 20 is designed to output a programmed current using the voltage source 10. An on/off control 22 charges the DUT 30 using the programmed current from the current source 20. More specifically, the output of the current source 20 at the terminal of the DUT 30 labeled Vcap-hi is the programmed current of the current source 20, and the programmed current is supplied when the on/off control 22 is on. For example, for a desired voltage of 5 volts, the current charging the DUT 30 (i.e., the programmed current) can be 5 mA.

The voltage source 10 and the current source 20 can be individually programmable elements. The voltage source 10 provides a programmed voltage to the current source 20, and the current source 20 provides the DUT 30 with a regulated output voltage that charges the DUT 30 linearly.

The current source 20 is shown functionally because, given the input characteristics of the voltage source 10 and the desired output, any number of circuit designs for the current source 20 are possible within the knowledge of those in this field. As another example, the voltage source 10 could be a switchable voltage source that is designed to switch between zero volts and the desired test voltage for the DUT 30. The current source 20 could then provide a regulated current output responsive to the switching of the voltage source. For example, the current source 20 could provide a current output proportional to the desired test voltage from the voltage source 10. No separate on/off control 22 for the current source would be incorporated.

The meter 50 is shown by a simplistic model of the meter's front end amplifier electronics in FIG. 1. The meter 50 measures the leakage current of the DUT 30 and can be a commercially-available measurement meter such as the Agilent 4349B High Resistance Meter. The front end amplifier electronics include an input amplifier 52 arranged as a current-to-voltage converter by including a grounded resistor 54 coupled to its non-inverting input and an input impedance 56 coupled to its inverting input. A capacitive feedback path 58 is provided from the output at Vout to the inverting input of the input amplifier 52.

The diode clamp 40 is provided by two diodes 42, 44 arranged in parallel such that the anode of the first diode 42 and the cathode of the second diode 44 are grounded and the cathode of the first diode 42 and the anode of the second diode 44 are electrically coupled to the virtual ground 60 of the input amplifier 52. The DUT 30 is also coupled to the virtual ground 60 at the terminal labeled Vcap-low, which is opposite from the DUT 30 terminal labeled Vcap-hi. The clamp diodes 42, 44 provide a current return path for the charge current of the DUT 30. In addition, the clamp diodes 42, 44 provide input protection for the meter 50 if the DUT 30 short circuits by clamping the voltage of the current source 20.

According to a known test procedure, the current source 20 is off (if the on/off control 22 is off or no signal is received from the voltage source 10), and the front-end (input) integrator amplifier 52 is inactive due to a closed switch 62 in parallel with the capacitive feedback path 58. The current source 20 is then turned on to charge the DUT 30 to its final test voltage. After the DUT 30 is charged to its final test voltage, measurement of the leakage current occurs using the meter 50 with the switch 62 open.

Figure 3:
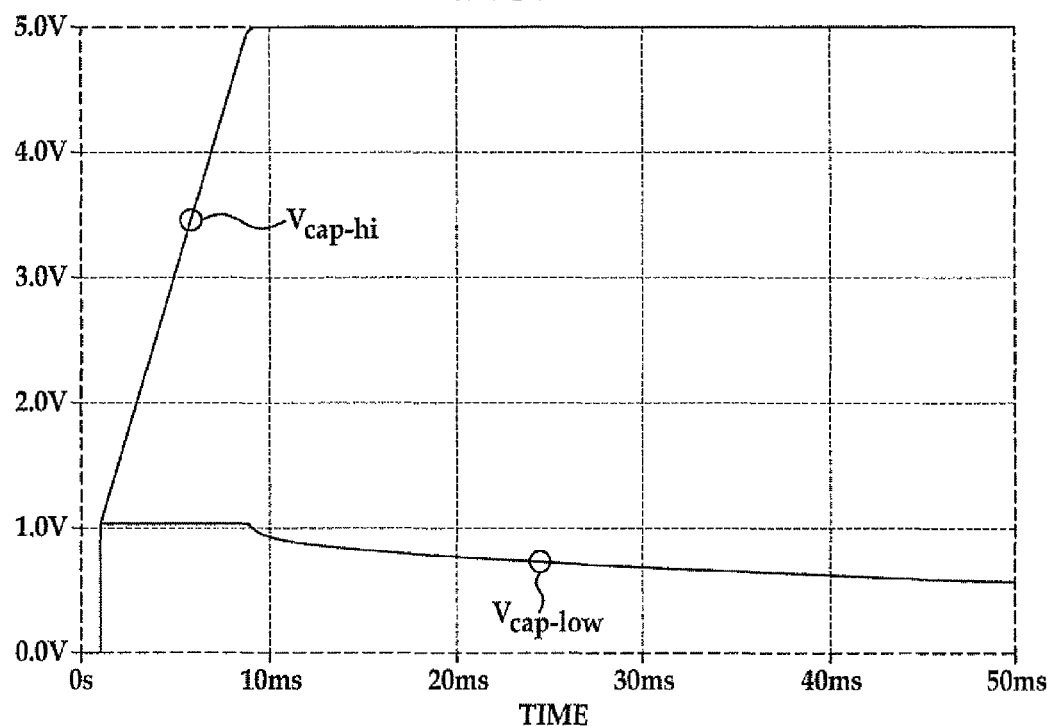
FIG. 3 is a plot over time of the measured terminal voltages referenced to the GND symbol in FIG. 1 of a device under test during conventional testing.

The output voltage at each of terminals Vcap-hi and Vcap-low of the DUT 30 is shown in FIG. 3 according to this known test procedure. In this example, the voltage source 10 varies from 0 volts to 5 volts, where 5 volts is the full charge voltage. The rise time is 100 µs, the fall time is 100 µs, and the time delay from time 0 sec to the start of the rise time is 1 ms. Accordingly, the pulse width is 75 ms with a period of 100 ms. The DUT 30 has a capacitance value of 100 µF.

During the test, the voltages initially rise to a voltage based on the V-I characteristic of the diode 44, which is above the virtual ground 60 input of the integrator amplifier 52. The voltage at Vcap-hi linearly increases with the application of current from the current source 20 until the voltage at Vcap-hi reaches the desired voltage, here 5 volts. The voltage at Vcap-low remains at the initial rise point and then gradually falls to a low voltage at or near zero volts.

The inventors have identified problems that arise with the use of this method in large-scale commercial test operations. First, the voltage across the DUT 30 is one diode drop (0.7 volts) less (or more, if two diodes are utilized) than the desired charge voltage at the end of the charge cycle. In the illustrated example of FIG. 3, the desired charge voltage is 5 volts. At such low test voltages, this difference from the desired charge voltage represents a large error in the leakage current as measured.

Of course, and as also shown in FIG. 3, the voltage at Vcap-low then exponentially decays to zero volts. However, the leakage measurement occurring during this exponential decay period is also inaccurate as the voltage at Vcap-low varies.

One solution is to wait until the voltage at Vcap-low reaches zero volts at the end of the exponential decay period. This solution can work in applications with small capacitive values. The inventors have discovered, however, that excessive time delays that can occur while awaiting the end of this decay period when the RC time constant of the input impedance 56 and the capacitance value of the DUT 30 is large, such as greater than 10 nF.

That is, measurement devices such as the meter 50 typically have a relatively high input impedance. In the graph shown in FIG. 3, for example, the input impedance 56 of the meter 50 is 1 kΩ. The time to exponentially decay to less than 1% (5 time constants) of the initial voltage at Vcap-low is 5τ or 5×(capacitance value of the DUT 30)×(resistance value of the input impedance 56). This time constant thus increases proportionally with the capacitance value of the DUT 30 such that large capacitance values can result in an excessively long time before leakage measurement can be initiated. Accordingly, measurement inaccuracies result if the measurement occurs before the decay is complete. Waiting until the decay is complete negatively impacts measurement throughput, which is undesirable in high-volume applications.

FIG. 1 also illustrates the addition of a switch 70 across the diode clamp 40. That is, a switch 70 is coupled between the virtual ground 60 input to the amplifier 52 and ground such that it is in parallel with the diodes 42, 44 of the diode clamp 40. According to a modification of the method described previously, the switch 70 is in the closed position while the DUT 30 is being charged by the current source 20. Then, the switch 70 is opened just before the meter 50 is commanded to measure the leakage current of the DUT 30.

Figure 2:
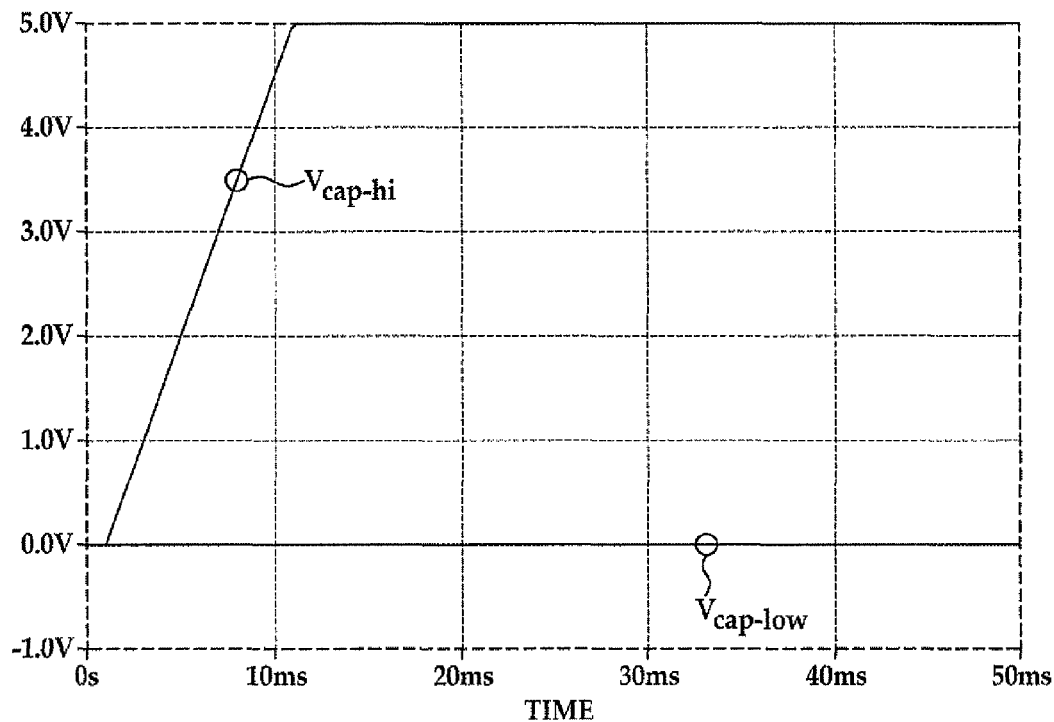
FIG. 2 is a plot over time of the measured terminal voltages referenced to the GND symbol in FIG. 1 of a device under test during operation of the circuit according to FIG. 1.

The output voltage at each of terminals Vcap-hi and Vcap-low of the DUT 30 according to this apparatus and method is shown in FIG. 2. Like the comparative example in FIG. 3, the voltage source 10 varies from 0 volts to 5 volts, where 5 volts is the full charge voltage. The rise time is 100 µs, the fall time is 100 µs, and the time delay from time 0 sec to the start of the rise time is 1 ms. Accordingly, the pulse width is 75 ms with a period of 100 ms. The DUT 30 has a capacitance value of 100 µF.

As can be seen in FIG. 3, the diode terminal (i.e., the terminal labeled Vcap-low) of the DUT 30 is at the same potential as the virtual ground 60 of the input amplifier 52 immediately. This eliminates the exponential decay time due to the meter's input impedance 56 that previously precluded immediate measurement after charging. In this example, instead of delays of greater than 50 ms as shown in FIG. 3, measurement of the leakage current of the DUT 30 can occur earlier, around 12 ms, as shown in FIG. 2. This represents a significant improvement.

The switch 70 is synchronously operated so that its timing is synchronized with the operation of the voltage source 10 and current source 20 and the operation of the meter 50 through the switch 62. The synchronous switch 70 can be, for example, a solid-state switch such as a relay with a low on-resistance. Alternately, a mechanical relay can be used. In high-volume applications, however, the number of switches can be as high as 500,000 per hour. The need for on-going maintenance of a mechanical relay makes such a relay less desirable than a solid-state switch.

The switch 70 is synchronously operated by a control device 80 such as a programmable processor, digital signal processor (DSP), timer, or the like. For example, the switch 70 can be a solid-state relay controlled by a programmable controller. This controller generally consists of a microcomputer including central processing unit (CPU), input and output ports (I/O) receiving data, random access memory (RAM), keep alive memory (KAM), a common data bus and read only memory (ROM) as an electronic storage medium for executable programs. The synchronous operations of the switch 70 in this example are implemented in software as the executable programs of the controller. In certain embodiments, the control device 80 can also operate the voltage source 10 and the switch 62. Alternately, separate control devices could operate each of the voltage source 10, the switch 62 and the switch 70 with coordination using one of the control devices or yet another device.

Capacitive component leakage current measurements in production environments require both accuracy and speed. The circuitry of the invention allows the diode terminal connection of the capacitive component, DUT 30, to be at the input amplifier's input virtual ground as soon as the capacitor is at its charged voltage. Leakage testing can begin shortly after the charging cycle is incomplete.

According to the teachings of the invention, capacitor leakage measurements can occur immediately after the charge cycle to improve the test system throughput for large value capacitances instead of waiting for the exponential voltage decay. Also, the leakage current is accurately measured by the measuring device instead of a measurement of a combination of leakage and exponential decay if the time before measurement is inadequate.

The above-described embodiments have been described in order to allow easy understanding of the present invention, and do not limit the present invention. On the contrary, the invention is intended to cover various modifications and equivalent arrangements included within the spirit and scope of the appended claims, which scope is to be accorded the broadest interpretation so as to encompass all such modifications and equivalent structures as is permitted under the law.

What is claimed is:

1. An apparatus for testing a capacitive component including a current source coupled to one terminal of the capacitive component and that supplies a current to the capacitive component to reach a desired test voltage and a meter coupled to a second terminal of the capacitive component that measures a leakage current across the capacitive component, the improvement comprising:
   a switch coupled between the second terminal of the capacitive component and ground; and
   a control device for the switch, the control device programmed to:
      keep the switch closed to ground while the current source supplies the current to the capacitive component;
      open the switch after the capacitive component reaches the desired test voltage at the one terminal and prior to measurement of the leakage current by the meter, the switch forming an open circuit when open; and
      maintain the switch in its open position while the meter measures the leakage current.

2. The apparatus according to claim 1, further comprising:
   a diode clamp coupled between the second terminal and ground, the switch in parallel with the diode clamp.

3. The apparatus according to claim 2 wherein the diode clamp comprises two reverse-connected diodes.

4. The apparatus according to claim 1, further comprising:
   a voltage source coupled to the current source to supply the desired charge voltage to the current source; and wherein the current source outputs the current based on the desired charge voltage.

5. The apparatus according to claim 4 wherein the current is a constant current proportional to the desired charge voltage.

6. The apparatus according to claim 1 wherein the control device is one of a timer, a digital signal processor and a programmable processor.

7. The apparatus according to claim 6 wherein the programmable processor is a microcontroller, the microcontroller including a stored program programmed to cause the microcontroller to:
   keep the switch closed to ground while the current source supplies the current to the capacitive component;
   open the switch after the capacitive component reaches the desired charge voltage at the one terminal and prior to measurement of the leakage current by the meter, the switch forming an open circuit when open; and
   maintain the switch in its open position while the meter measures the leakage current.

8. The apparatus according to claim 1, further comprising:
   a voltage-limiting path between the second terminal and ground and present when the switch is open and when the switch is closed.

9. The apparatus according to claim 1 wherein the switch is directly coupled to each of the second terminal and to ground and wherein the current source is directly coupled to the one terminal of the capacitive component.

10. The apparatus according to claim 1 wherein the second terminal of the capacitive component is coupled to the meter while the control device keeps the switch closed to ground such that the control device maintains both the second terminal of the capacitive component and an input to the meter coupled to the second terminal at a ground potential of ground while the current source supplies current to the capacitive component; and wherein the current source is at a same voltage potential as the one terminal of the capacitive component.

11. An apparatus for testing a capacitive component including a first terminal coupleable to a current source configured to supply a current to the capacitive component, the apparatus comprising:
   a switch coupled between a second terminal of the capacitive component and ground such that when the switch is closed, the second terminal of the capacitive component is at a ground potential of ground, and when the switch is open, the switch forms an open circuit;
   means for closing the switch to ground before the current source charges the capacitive component to a desired test voltage at the first terminal and keeping the switch closed to ground while charging the capacitive component to the desired test voltage at the first terminal;
   means for opening the switch after the capacitive component reaches the desired test voltage at the first terminal and before measurement of a leakage current of the capacitive component and keeping the switch open while measuring the leakage current; and
   a measurement circuit for measurement of the leakage current with the switch open, the measurement circuit having an input coupled to the second terminal such that the input and the second terminal are at a same voltage potential.

12. The apparatus according to claim 11, further comprising the current source wherein the current source includes:
   a voltage source producing the desired test voltage; and wherein the current source produces the current regulated to a desired charge current.

13. The apparatus according to claim 11, further comprising:
   two reverse-connected diodes forming a diode clamp and coupled between the second terminal and ground.

14. The apparatus according to claim 11, further comprising:
   a voltage-limiting path between the second terminal and ground and present when the switch is open and when the switch is closed.

15. A method for testing a capacitive component comprising:
   A) charging one terminal of the capacitive component to a desired test voltage using a current from a current source while a switch coupled between a second terminal of the capacitive component and ground is closed to ground;
   B) opening the switch when the one terminal of the capacitive component reaches the desired test voltage so that the switch forms an open circuit; and
   C) after opening the switch and with the switch open, measuring a leakage current of the capacitive component using a measurement circuit coupled to the second terminal of the capacitive component.

16. The method according to claim 15, further comprising:
   closing the switch to ground after measuring the leakage current of the capacitive component.

17. The method according to claim 16, further comprising:
repeating A) through C) for a second capacitive component after closing the switch to ground.

18. The method according to claim 15 wherein a voltage-limiting path is between the second terminal and ground and is present when the switch is open and when the switch is closed.

19. The method according to claim 15 wherein the measurement circuit is coupled to the second terminal of the capacitive component while charging the one terminal of the capacitive component.

20. The method according to claim 15 wherein when the switch is closed, the second terminal of the capacitive component is at a ground potential of ground; and wherein the current source includes an output terminal coupled to the one terminal of the capacitive component, the one terminal and the output terminal being at a same voltage potential.

* * * * *